United States Patent [19]
Sooch et al.

[11] Patent Number: 5,087,914
[45] Date of Patent: Feb. 11, 1992

[54] DC CALIBRATION SYSTEM FOR A DIGITAL-TO-ANALOG CONVERTER

[75] Inventors: Navdeep S. Sooch; Jeffrey W. Scott, both of Austin, Tex.; Tadashi Tanaka, Aiko, Japan

[73] Assignee: Crystal Semiconductor Corp., Austin, Tex.

[21] Appl. No.: 571,375

[22] Filed: Aug. 22, 1990

[51] Int. Cl.$^5$ .................................. H03M 1/10
[52] U.S. Cl. ............................. 341/120; 341/118
[58] Field of Search ............ 341/120, 121, 118, 119, 341/122, 144, 143; 324/74, 130; 364/571.01, 571.04, 571.05, 571.07

[56] References Cited

U.S. PATENT DOCUMENTS

| | | | |
|---|---|---|---|
| 4,222,107 | 9/1980 | Mrozowski et al. | 364/571.05 |
| 4,272,760 | 6/1981 | Prazak et al. | 341/120 |
| 4,829,236 | 5/1989 | Brenardi et al. | 324/74 |

*Primary Examiner*—A. D. Pellinen
*Assistant Examiner*—Brian K. Young
*Attorney, Agent, or Firm*—Ross, Howison, Clapp & Korn

[57] ABSTRACT

A calibration system for a digital-to-analog converter (DAC) includes a digital portion (10) having a interpolation section (14) for receiving the digital input and increasing the sampling frequency thereof for input to a delta-sigma modulator (16). A summing junction (24) is disposed between the interpolation circuit (14) and the delta-sigma modulator (16) to allow an offset voltage to be summed therewith. The offset value is stored in an offset register (26), which is controlled by a calibration control circuit (40). The output of the delta-sigma modulator (16) is input to an analog section (12), which is comprised of an analog filter (22) and an output amplifier (28). The output amplifier (28) is operable to sample the output of the analog filter (22) and feed this back to a gate (38). The gate (38) is activated during a calibration cycle to feed the comparator output back to the calibration control circuit (40). During the calibration cycle, the output is isolated by an isolation amplifier (32) and the analog output pad connected to ground by a switch (44) to provide a low impedance output on the analog output. The calibration control circuit (40) is operable to perform a binary search while sampling the output of the analog section (12) with the input to the interpolation circuit (14) forced to a logic low.

31 Claims, 4 Drawing Sheets

DC CALIBRATION SYSTEM FOR A DIGITAL-TO-ANALOG CONVERTER

TECHNICAL FIELD OF THE INVENTION

The present invention pertains in general to digital-to-analog converters, and more particularly, to a calibration system for removing the DC offset from the digital-to-analog converter, and its associated analog reconstruction filter.

CROSS REFERENCE TO RELATED APPLICATIONS

This application is related to U.S. Pat. application Ser. No. 07,571,376, filed concurrent herewith.

BACKGROUND OF THE INVENTION

In the digital audio and telecommunications fields, the high accuracy and high resolution digital-to-analog conversion (DAC) technology has become one of the key analog circuit technologies. Conventionally, either the weighted network circuit technique with trimming, or the multislope integration technique has been utilized for high resolution DACs. In the weighted network, some trimming of the weighted network utilizing a laser, dynamic element matching, or the digital method utilizing Read-Only Memory (ROM), was required. This is due to the conversion accuracy, which depended in large part on the device matching tolerance of the weighted network. Typically, untrimmed weighted networks would yield a fourteen bit accuracy, whereas the trimmed network could attain a conversion accuracy of over fifteen bits. In the multislope integration circuit technique, on the other hand, integrators, sample and hold circuits and current sources are required, which of necessity must be high speed devices with relatively high accuracy. High resolution DACs utilizing this technology are difficult to realize due to the sample charge and the sample capacitor leaking through the base impedance of the transistors, which typically use bipolar technology.

Another technique that has come to the forefront in DAC technology is that utilizing oversampling conversion techniques. These typically utilize a delta-sigma modulator in conjunction with conventional oversampling noise shaping techniques utilizing digital filters. Typically, an interpolation filter is utilized to increase the sample rate and then filter all images and quantization noise at $F_s/2$ and above, $F_s$ being the input sampling frequency. The output of the interpolation filter is then processed through a sample and hold circuit to provide the oversampled output. If the interpolation filter provides a factor of 8x increase in the sampling rate, the sample and hold circuit could provide another 8x of increase to result in a total of 64x of oversampling. The delta-sigma modulator receives the output of the combined interpolation filter and sample and hold circuit and converts this oversampled signal into a one-bit data stream. This one-bit output controls a DAC, which has only two analog levels and, therefore, is inherently linear. This signal is then input to an analog low pass filter.

With the oversampling noise shaping techniques utilized with high resolution DACs, two problems have been recognized—DC offset and phase linearity. The digital portion of the DAC comprising the interpolation filter, sample and hold circuit and the delta-sigma modulator can be designed such that they are substantially phase linear, and DC offset can also be provided. However, when the analog portion of the overall DAC system is implemented, i.e., the analog low pass filter, an additional level of DC offset may be introduced into the system in addition to a phase response non-linearity. It is very difficult to remove DC offset and provide a linear phase response in the analog portion of the DAC converter system. In applications such as digital audio, this DC offset and phase response linearity is audible and detracts from the high quality of audio that is desired. In view of these disadvantages, it is desirable to provide a DAC system that provides a method to calibrate the DC offset for the combined digital-to-analog portions of the DAC system, and also provide an overall phase linearity for the system.

SUMMARY OF THE INVENTION

The present invention as disclosed and claimed herein comprises a digital-to-analog converter with an integrated calibration system for calibration of D.C. offset. The system includes a digital-to-analog converter for receiving a digital input signal and outputting an analog output signal having an analog level corresponding to the value of the digital input signal. An offset circuit is provided for offsetting the analog level by an offset value for a given digital input value. Calibration circuitry is provided to determine the offset value in response to the generation of a calibration signal. The offset signal is set by the calibration circuitry such that a predetermined digital input value on the digital input will result in the output of a predetermined analog output value.

In another aspect of the present invention, the calibration circuit is operable to determine the offset value by sampling the analog output signal with the predetermined digital value input on the digital input, and varying the offset value until the analog output signal is substantially equal to the predetermined analog output value. The offset value is a digital value which is stored in an offset register. A summing junction is provided on the input to the digital-to-analog converter, which is operable to receive the digital input signal and the output of the offset register.

In a further aspect of the present invention, the calibration circuit forces the input to the digital-to-analog converter to a substantially zero digital input value. The output of the digital-to-analog converter is then sampled, and the offset value in the register varied until the analog output value is substantially equal to zero. An amplifier capable of being enabled and disabled is provided for isolating the analog output of the digital-to-analog converter from an analog output pad and a switch is provided for disposing the analog output pad at a predetermined voltage during the calibration procedure.

In a yet further aspect of the present invention, the digital-to-analog converter includes an interpolation filter for increasing the sampling rate of the digital-to-analog converter and outputting the interpolated digital value to a delta-sigma modulator for converting the signal to a one-bit digital stream, which is then input to a one-bit DAC. An analog low pass filter is provided for filtering the one-bit DAC to provide the analog output value.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
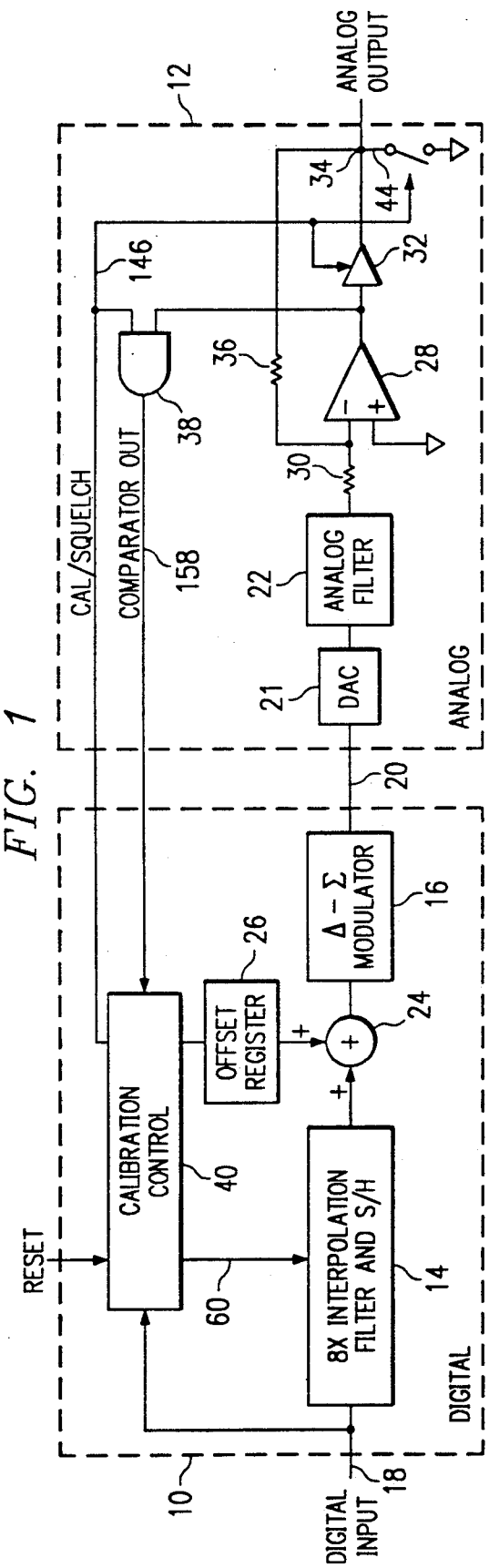
FIG. 1 illustrates a block diagram of the digital and analog portions of the DAC system with the calibration control and offset register.

Referring now to FIG. 1, there is illustrated a digital-to-analog converter system (DAC). The DAC system is comprised of a digital portion 10 and an analog portion 12. The digital portion 10 is comprised in part of an interpolation circuit 14, that includes an interpolation filter and a sample and hold circuit. The digital portion 10 also includes a delta-sigma modulator 16. The digital portion effectively converts the digital input signal on an input 18 to a one-bit digital stream on an output 20. The output 20 is input to the analog portion 12, analog portion 12 being generally comprised of a one-bit DAC 21 and an analog low pass filter 22. Although a delta-sigma modulator is illustrated, it should be understood that any type of one-bit quantizer or equivalent can be utilized to provide the conversion to a one-bit digital stream. The delta-sigma modulator is utilized as it provides good low level performance and differential non-linearity. The general operation of the digital portion 10 is known in the art and described in Yasuykui Matsuya, Kuniharu Uchimura, Atsushi Awaiti and Takayo Kaneko, "A 17-Bit Oversampling D-to-A Conversion Technology Using Multi-Stage Noise Shaping", IEEE J. of Solid-State Circuits, Vol. 24, No. 4, August 1989, which is incorporated herein by reference.

The output of the interpolation circuit 14 is connected to the input of a summing circuit 24, the output of which is connected to the input of the delta-sigma modulator. The other input of the summer 24 is connected to the output of an offset register 26. The contents of the offset register 26 provide a DC offset that is utilized to correct for any DC drift problems that may occur throughout the system illustrated in FIG. 1. As will be described hereinbelow, the contents of the offset register 26 are determined by an internal calibration scheme.

The analog filter 22 in the analog portion 12 has an amplifier 28 provided on the output thereof. The positive input of the amplifier 28 is connected to ground and the negative input thereof is connected through a resistive element 30 to the output of the analog filter 22. The output of amplifier 28 is connected to the input of a second stage of amplification 32, which provides a disable feature, the output of second stage 32 connected to the analog output pad associated with a node 34. A resistive element 36 is illustrated as being connected between the negative input of the amplifier 28 and the node 34. The output of amplifier 28 is input to one input of a gate circuit 38, the output of which is connected to an input of a calibration control circuit 40. The other input of the gate 38 is connected to a CAL/SQUELCH signal output by the calibration control circuit 40. The calibration control circuit 40 is operable to set the contents of the offset register 22 to an offset value. The calibration control circuit 40 also receives a digital input 18 and a reset input. The calibration control circuit 40 also outputs a control line to the interpolation circuit 14 to force the output thereof to all zeroes during a calibration cycle. For calibration purposes, a switch 44 is provided on the analog output between node 34 and ground. When node 34 is grounded, resistor 36 is also grounded through switch 44, this causing amplifier 28 to run "open loop" and function as a comparator.

In operation, the calibration control circuit 40 is operable to initiate an internal calibration procedure that first forces the output of the interpolation circuit 14 to an all zero state, and then sets the contents of the offset register 26 to a predetermined value. This provides the primary input to the delta-sigma modulator 16. The output of the amplifier 28 is then sampled by the calibration control circuit 40 to determine if the output of the analog filter 22 is above zero. If the output of the analog filter 22 is above zero, the output of the amplifier 28 will be at a logic zero. When the output of analog filter 22 falls below zero, the output of amplifier 28 will go to a logic "1". The contents of the offset register 26 are varied through a range of values until the transition on the output of the amplifier 28 is found, thus indicating the proper offset to result in a zero output from analog filter 22 with a zero input from the interpolation circuit 14. During the calibration procedure, the switch 44 is closed and the output amplifier 32 has the output thereof disabled. Although the summing circuit 24 is illustrated as being disposed between the interpolation circuit 14 and the input of the delta-sigma modulator 16, it should be understood that the summing circuit could be placed on the digital input to the interpolation circuit 14. However, it has been determined that from a circuit design standpoint the offset operation should be disposed between the interpolation circuit and the delta-sigma modulator 16.

Figure 2:
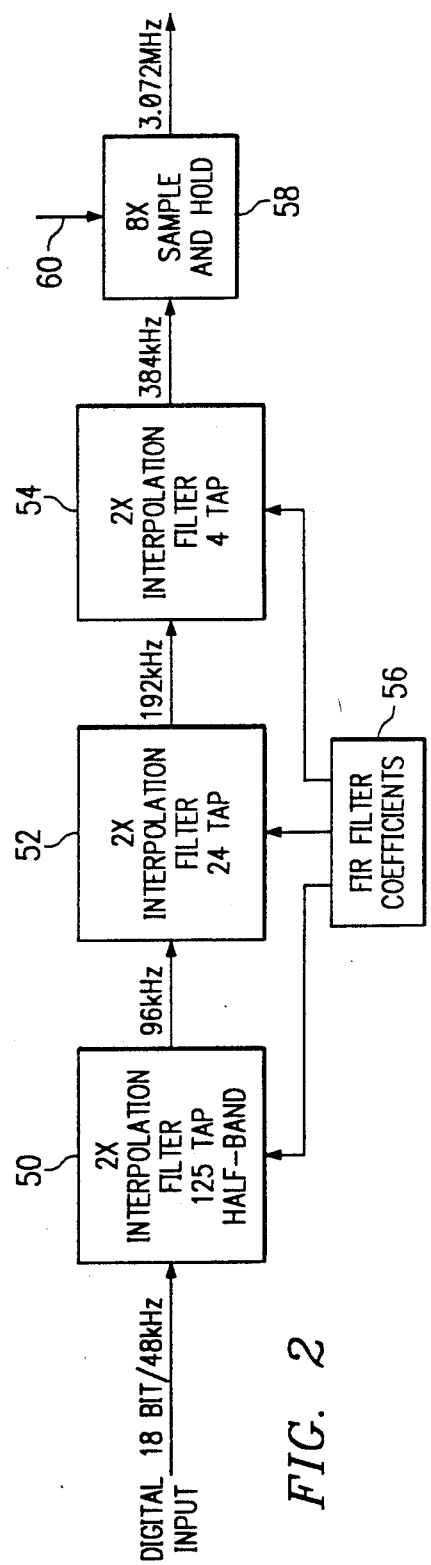
FIG. 2 illustrates a block diagram of the interpolation filter and the sample and hold circuit.

Referring now to FIG. 2, there is illustrated a block diagram of the interpolation circuit 14 including the interpolation filter and the sample and hold circuit. The interpolation filter is illustrated in a three-stage topology, a 2x interpolation filter 50, that is a one hundred twenty-five tap half band filter, a 2x interpolation filter 52, that is a twenty-four tap filter and a 2X interpolation filter 54, that is a four tap filter. The interpolation filter 50 is operable to increase the sampling frequency for an eighteen-bit 48 Khz input signal to an eighteen-bit 96 kHz signal. The interpolation filter 52 is operable to increase the sampling frequency from 96 kHz to 192 kHz and the 2x interpolation filter 54 is operable to transform the 192 kHz rate to a 384 kHz rate. The three stage topology was chosen for area and computation efficiency. As described in a co-pending application, the interpolation filter 52 is utilized to compensate for the phase and frequency response of the analog filter 22 in the analog section 12. However, all three interpolation filters 50, 52 and 54 could be utilized to provide compensation for this phase and frequency response. Substantial computation savings (i.e., number of multiplications per second) are realized by implementing the interpolation filter 50 with a half band filter, wherein every other coefficient is zero. The interpolation filters 52 and 54 are also realized with FIR filters, with each of the FIR filters having the associated filter coefficients stored in a memory 56.

Each of the FIR filters is realized utilizing a digital signal processing unit (DSP) that is essentially an arithmetic logic unit (ALU), which has the inputs thereof multiplexed to perform the calculations necessary to realize the filter function. Typically, digital filters are comprised of a series of multiplication and addition/subtraction steps which must be executed in a predetermined order, which order is sequential. Therefore, the digital input values are processed through each of the FIR filters 50-54 in accordance with the coefficients stored in the memory 56. This provides the filtering and interpolation function for output from the third stage interpolation filter 54.

The 384 kHz output from the third stage interpolation filter 54 is input to an 8x sample and hold circuit 58, which is operable to increase the sampling frequency to 3.072 MHz. This is then input to the summing junction 24. In addition, a control line 60 is received from the calibration control 40. The control line 60 is operable to force the output of the sample and hold circuit 58 to an "all zeroes" state for the purpose of calibration, which will be described in more detail hereinbelow.

Figure 3:
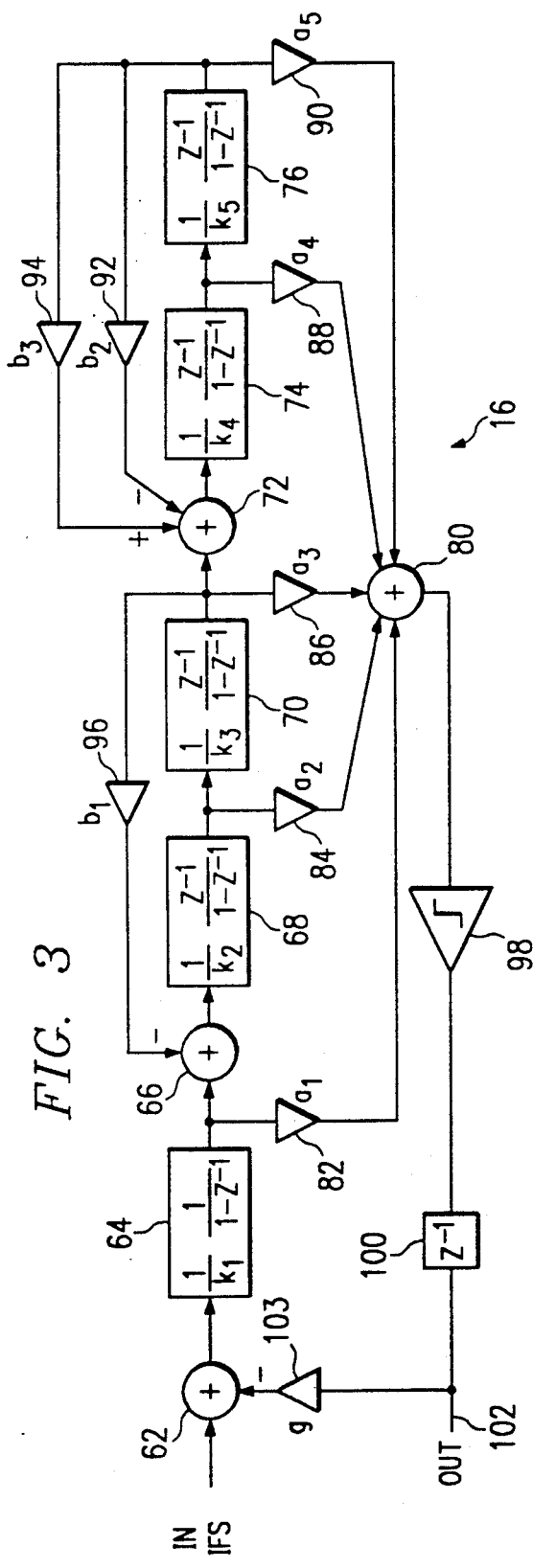
FIG. 3 illustrates a block diagram of the delta-sigma modulator.

Referring now to FIG. 3, there is illustrated a block diagram of the delta-sigma modulator 16 that converts the eighteen-bit digital signal to a one-bit digital stream. The signal output by the summing junction 24 is input to a summing junction 62 and then to a first stage of integration 64. The output of the first stage of integration 64 is input to a summing junction 66, the output of which is input to a second stage of integration 68. The output of the second stage of integration is input to the input of a third stage of integration 70. The output of the third stage of integration is input to a summing junction 72, the output of which is input to the input of a fourth stage of integration 74. The output of the fourth stage of integration 74 is input to the input of a fifth stage of integration 76. The output of each of the stages of integration 64, 68, 70, 74 and 76 are input to a summing junction 80 through feed forward paths 82, 84, 86, 88 and 90, respectively, each having coefficients $a_1$, $a_2$, $a_3$, $a_4$ and $a_5$, respectively. The output of the fifth stage of integration 76 is input to the summing junction 72 along a negative feedback path 92, having a coefficient $b_2$ associated therewith. A negative sign on the input to the summing junction 72 indicates a subtraction process. In addition, the output of the fifth stage of integration 76 is also input along a positive feedback path 94 to the input to the summing junction 72 and having a coefficient $b_3$ associated therewith. A positive sign is indicated on the input of the feedback path 94 to the summing junction 72 to indicate the addition operation. A feedback path 96 is provided for connecting the output of the third stage of integration to the input of summing junction 66 at the input of the second stage of integration 68, the feedback path 96 being a negative feedback path and having a coefficient $b_1$ associated therewith.

The output of the summing junction 80 is input to a one-bit quantizer 98 that converts the output of summing junction 80 into a signal that is plus or minus full scale. The output of the quantizer 98 is passed through a delay transfer function 100 to provide the output on a line 102. The output on line 102 is also input back through a function block 103 having a coefficient g to the input of the summing block 62 to sum with the digital input signal to the delta-sigma modulator 16. The structure of FIG. 3, therefore, realizes a fifth order delta-sigma modulator. The coefficients for the fifth order modulator illustrated in FIG. 3 are listed in TABLE 1.

TABLE 1

| Delta-Sigm Modulator Coefficients | | | | |
|---|---|---|---|---|
| $k_1$ | 1 | $a_1$ | 1 | $b_1$ | 1/1024 |
| $k_2$ | 1 | $a_2$ | ½ | $b_2$ | 1/16 |
| $k_3$ | ½ | $a_3$ | ½ | $b_3$ | 1/64 |
| $k_4$ | ½ | $a_4$ | ½ | g | 2.5 |
| $k_5$ | ½ | $a_5$ | ½ | | |

Figure 4:
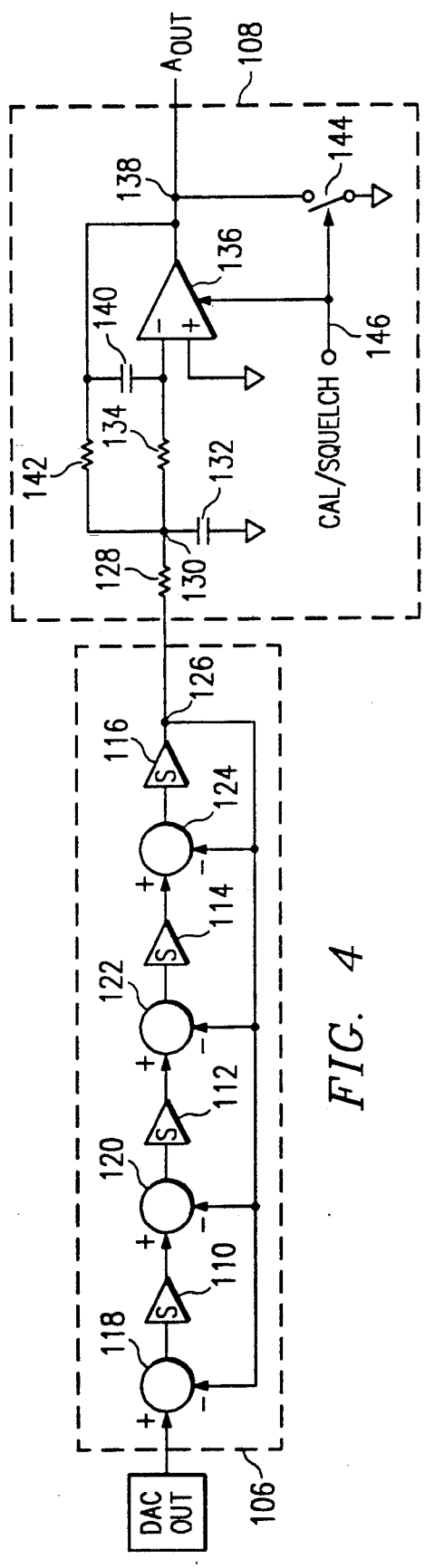
FIGS. 4, 4a and 4b illustrate schematic diagrams of the switched capacitor filter and continuous time filter that comprise the analog low pass filter.

Referring now to FIG. 4, there is illustrated a schematic block diagram of the analog section 12 including the analog filter 22. The analog filter 22 is comprised of two sections, a switched capacitor filter 106, and a continuous time filter section 108. The switched capacitor filter section 106 comprises a fourth order Butterworth low-pass filter, whereas the continuous time filter section 108 is comprised of a second order Butterworth low-pass filter.

The switched capacitor filter section 106 is comprised of four switched capacitor stages, 110, 112, 114 and 116. The analog input is input to the positive input of a summing junction 118, the output of which is connected to the input of the first switched capacitor stage 110. The output of the switched capacitor stage 110 is input to the positive input of a summing junction 120. The output of summing junction 120 is input to the input of the second switched capacitor stage 112, the output of which is connected to the positive input of summing junction 122. The output of summing junction 122 is input to the input of the third switched capacitor stage 114, the output of which is connected to the positive input of a summing junction 124. The output of summing junction 124 is input to the input of a switched capacitor stage 116, the output of which is connected to a node 126. Node 126 is fed back to the negative inputs of each of the summing junctions 118, 120, 122 and 124.

The continuous time filter section 108 has the input thereof connected to node 126, node 126 being connected through a resistor 128 to a node 130. A capacitor 132 has one plate thereof connected to node 130, and the other plate thereof connected to ground. Node 130 is connected through a resistor 134 to the negative input of an amplifier 136, the positive input of which is connected to ground. The amplifier 136 is essentially an op amp for the purposes of realizing the filter. The output of the amplifier 136 is connected to the analog output pad at node 138. Node 138 is connected through a series capacitor 140 to the negative input of the amplifier 136. Node 138 is also connected through a resistor 142 to the node 130. A switch 144 is connected between the analog output pad at node 138 to ground. A control signal CAL/SQUELCH is input on a line 136 to both the amplifier 136 and the switch 144. As will be described hereinbelow, the control line 146 is operable to disable the output of the amplifier 136 from the analog output node 138 and also close switch 144 during a calibration operation. This will cause the first stage of amplifier 136 to function as a comparator.

Figure 4A:
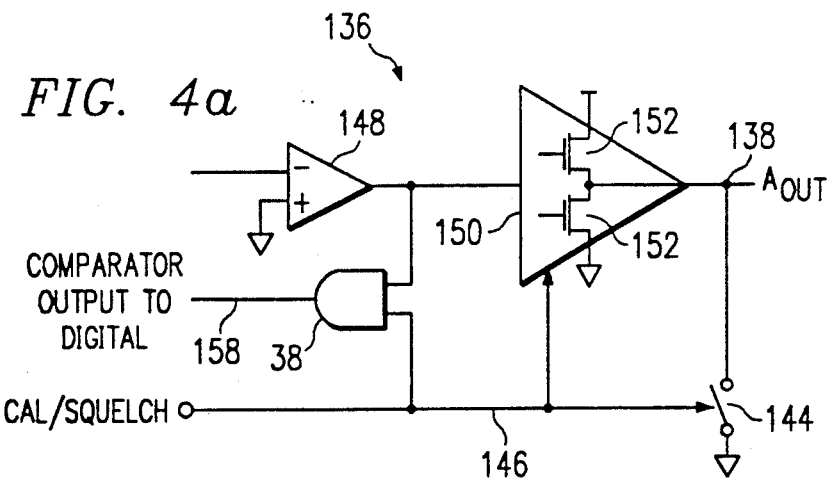

Referring now to FIG. 4a, there is illustrated a more detailed view of the amplifier 136. The amplifier 136 is comprised of a first stage 148 and an output stage 150. The output stage 150 has two CMOS transistors 152 disposed therein, one having the source/drain path connected between the positive supply and the output node 138 and one transistor having the source/drain path connected between the node 138 and ground. The transistors 152 are controlled by the CAL/SQUELCH signal on line 146 to isolate the node 138 from the output of first stage 148. The output of stage 148 provides the comparator operation, which output is connected to one input of the gate 38. The other input of gate 38 is connected to the line 146. Therefore, when the calibration operation is initiated, switch 144 is closed and node 138 is grounded.

Figure 4B:
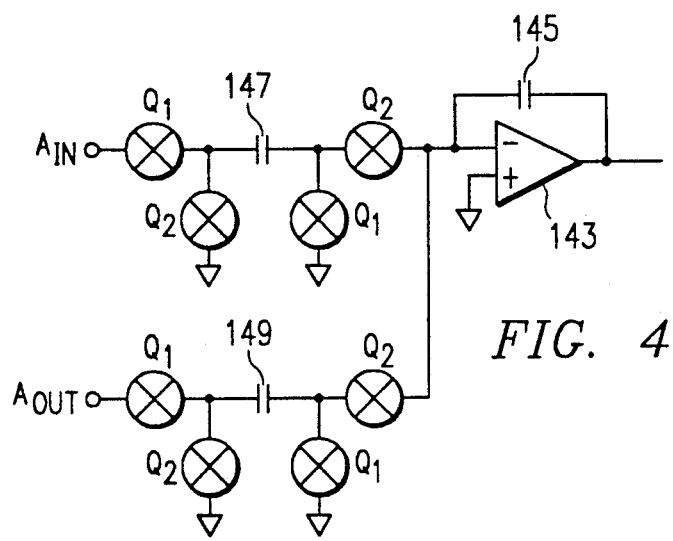

Referring now to FIG. 4b, there is illustrated a detail of each of the switched capacitor stages 110–116. Each of the stages is comprised of an amplifier stage 143, having a feedback capacitor 145 disposed between the negative input thereof and the output. A switched capacitor 147 is provided on the input, which is connected from the output of the preceding one of the summing junctions 118–124 with appropriate switches disposed thereabout. The switches are controlled by signals $\phi_1$ and $\phi_2$. In a similar manner, the feedback leg has a switched capacitor 149 disposed in series therewith and input to the negative input of the amplifier 143. Similar switches are provided in a switched capacitor configuration and controlled by the timing signals $\phi_1$ and $\phi_2$. This is a conventional structure.

Figure 5:
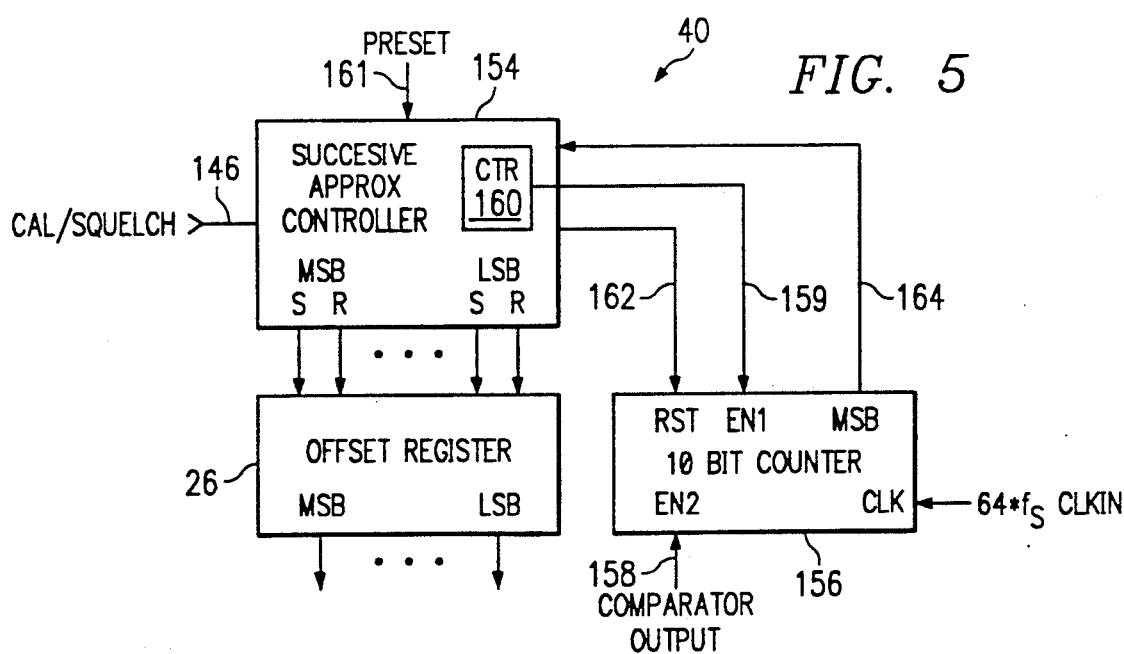
FIG. 5 illustrates a logic diagram for the calibration control system and offset register.

Referring now to FIG. 5, there is illustrated a block diagram of a calibration control circuit 40. The offset register is a 16 bit register. A successive approximation controller 154 is provided and is operable to interface with the offset register 26. The offset register 26 has the 16 bits thereof extending from an LSB to an MSB. The successive approximation controller 154 is operable to either reset each of the bits in the offset register 26 to a logic "0" or to set each of the bits to a logic "1". The successive approximation controller 154 is operable to initially reset all of the registers in the offset register 26 to a logic "0" and then successively set each bit high, beginning with the MSB, wait for a reset signal, if appropriate, at the end of a cycle, which when it occurs will reset the bit back to zero, and then cycle to the next lower bit. The CAL/SQUELCH signal is input to the successive approximation controller 154 on the line 146 to initiate the operation.

A ten-bit counter 156 is provided having two enable inputs, EN1 and EN2, which are operable to enable the counter 156. The enable input EN1 is connected through a line 159 to an output from the successive approximation controller 154. The signal output on line 159 is generated by an internal counting circuit 160. A reset signal is output by the successive approximation controller 154 on a line 162 to reset the ten-bit counter for each bit tested by the successive approximation controller 154. The MSB of the counter 156 is provided as an output on a line 164 to a reset input on the successive approximation controller 154. As will be described hereinbelow, a line 164 and the signal thereon are operable to prevent the bit being tested from being reset to a logic "0". The comparator output on the line 158 is input to the EN2 enable input and, when combined with the clock input, increments the counter 156. The clock input is connected to a signal that is 64 times the sampling frequency $F_s$.

Figure 5A:
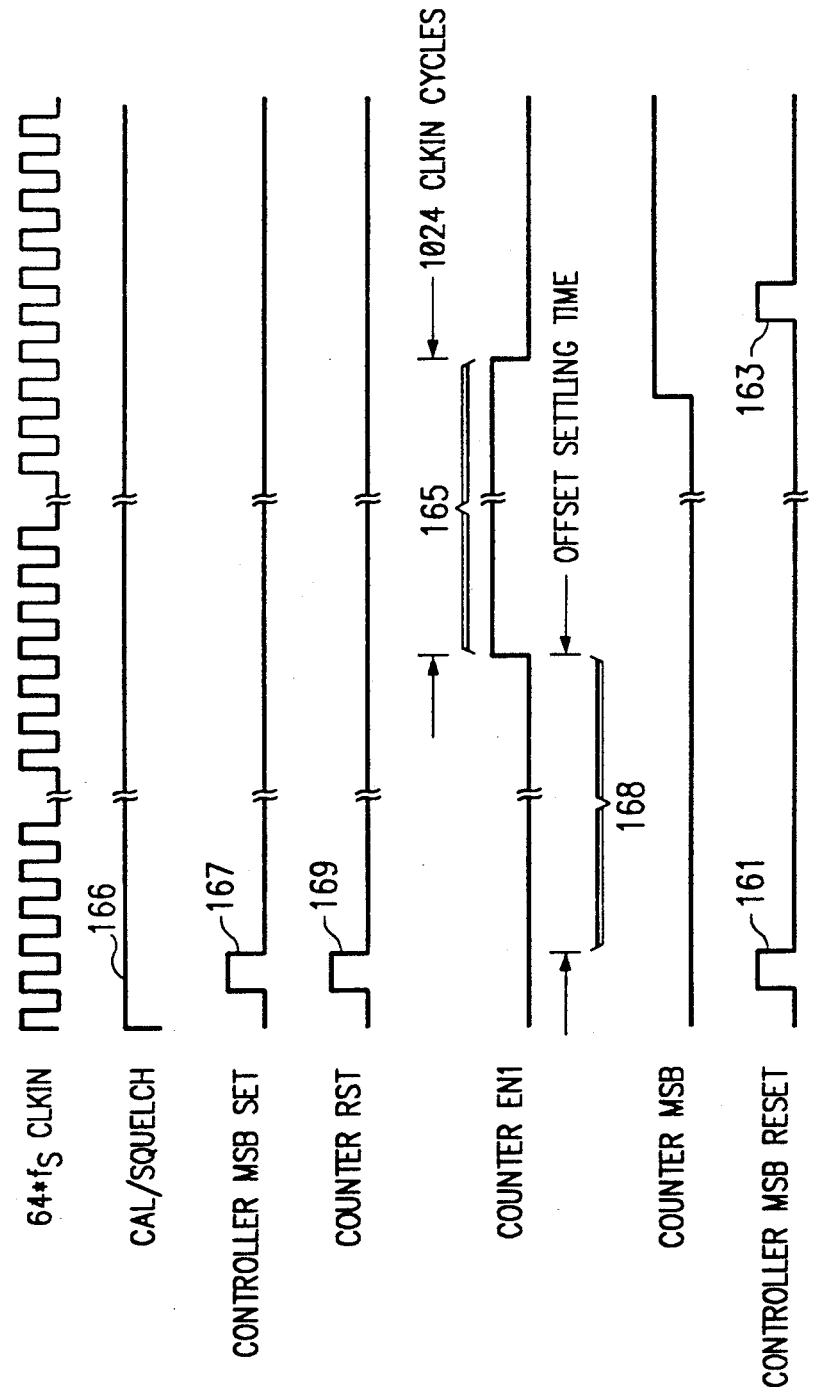
FIG. 5a illustrates a timing diagram for the calibration circuit.

Referring now to FIG. 5a, there is illustrated a timing diagram for the calibration operation. The CAL/SQUELCH signal is represented by a signal 166, the rising edge of which initiates the calibration procedure.

The controller 154 MSB is represented by a second pulse 167 that follows the pulse 166. A counter reset signal 169 is generated at the same time as the pulse 167, and is output on line 162 to the counter 156 to reset the count value therein to zero. The EN1 enable input to counter 156 on line 159 is maintained at a low level for a predetermined settling time 168. This settling time is provided to allow the DAC to settle for a predetermined amount of time after a new input value has been applied to the input of the DAC, this input being all logic "0"s at the input to the summing junction 24. Typically, the analog low pass filter 22 is the primary circuit component that accounts for this need. The enable line 159 then goes high, as represented by a pulse 165, for 1024 clock cycles, this being the same clock that is input to the ten-bit counter 156. The counting function is provided by counter 160. At the end of the 1024 clock cycles, the counter MSB line 164 is sampled as a reset signal, which when it is high, does not reset the particular bit. The reset function occurs at a pulse 163 which, if the counter MSB is low, results in the resetting of the bit to zero. Thereafter, the next adjacent bit to the MSB is set, the DAC allowed to settle for the offset settling time indicated by reference number 168, and then the comparator output sampled over 1024 clock cycles. This continues for all sixteen bits.

The successive approximation controller in a second mode is allowed to receive a signal on a Preset input 161. The Preset input 161 forces a bit other than the MSB bit to be the first bit set in the successive approximation routine. In addition, when the Preset signal 161 is utilized, the CAL/SQUELCH signal does not reset all of the bits in the offset register 26. The value in the register is maintained such that the search can proceed in a shorter time.

The calibration control circuit 40, as described above, is operable to generate the CAL/SQUELCH signal in response to an external reset signal. In addition, the calibration control signal 40 is operable to be connected to the digital input 118 and detect when all of the bits thereof are at a logic "0" for a predetermined period. In this condition, the calibration control circuit 40 generates the CAL/SQUELCH signal. In this manner, a low noise grounded output is provided whenever the DAC output is at a true zero input value. Whenever this mode is entered, the calibration control 40 is operable to reset the bit position counter 156 such that the calibration does not start from a zero offset value. Rather, it starts from an offset value that is slightly less than the previously stored offset value in offset register 26. In this manner, it is not necessary to go through the entire binary search provided by the bit control circuit 154, but rather through a modified search.

Although the above calibration procedure was described with reference to a zero offset, the gain of the delta-sigma modulator 16 could be adjusted. This would require a measurement of two voltages, a low voltage and a high voltage, for a known input. The known input could be summed into summing junction 24 through the offset register 26 and then a measurement taken. A calculation could be made and the gain of the delta-sigma modulator adjusted. This would be very similar to the procedure described in U.S. Pat. No. 4,943,807, issued to Early, et al., on July 24, 1990, and assigned to the present assignee, which patent is incorporated herein by reference.

In summary, there has been provided a D.C. calibration system for a digital-to-analog converter. The digital-to-analog converter is placed into a calibration mode and the input thereof forced to logic "low" state. A known offset voltage is then input to the DAC and the value thereof varied in a binary search pattern. When the output is at a true zero, this offset value is stored in the register and then summed with the external input during normal operation. During the calibration procedure, the output is disabled and held at a ground voltage level to provide a low impedance load on the output.

Although the preferred embodiment has been described in detail, it should be understood that various changes, substitutions and alterations can be made therein without departing from the spirit and scope of the invention as defined by the appended claims.

What is claimed is:

1. A digital-to-analog converter with an integrated calibration system, comprising:
   a digital-to-analog converter for receiving a digital input signal on a digital input and outputting an analog output signal having an analog output level corresponding to the digital value of said digital input signal;
   an offset circuit for offsetting said analog output level by an offset value, said offset circuit including:
      a digital summing junction disposed within said digital-to-analog converter, and
      an offset register for storing said offset value as a digital value, the output of said offset register input to a digital input of said digital summing junction for summing with a digital signal in the processing path of said digital-to-analog converter;
   sampling circuitry for sampling the analog output level of said analog output signal of said digital-to-analog converter when a predetermined calibrating digital input signal is input to said digital-to-analog convertor; and
   register control circuitry for varying said offset value in said offset register until the analog output level of said analog output signal is substantially equal to a predetermined calibration analog output signal when said predetermined calibrating digital input signal is input to said digital-to-analog convertor.

2. The system of claim 1, wherein said predetermined calibration digital input signal has a value of substantially zero and said predetermined calibrating analog output signal has a value of substantially zero.

3. The system of claim 1, and further comprising:
   an analog output terminal for receiving said analog output signal from said digital-to-analog converter;
   a disabling circuit for isolating said analog output from said analog output terminal in response to generation of said calibration signal; and
   a voltage control circuit for disposing said analog output terminal at a predetermined voltage when said analog output terminal is isolated from the output of said digital-to-analog converter by said disabling circuit.

4. The system of claim 1, wherein said digital-to-analog convertor comprises a delta-sigma digital-to-analog convertor.

5. A digital-to-analog converter with an integrated calibration system, comprising:
   a digital-to-analog converter for receiving a digital input signal on a digital input and outputting an analog output signal having an analog output level corresponding to the digital value of said digital input signal, said digital-to-analog converter including:
      an interpolation filter for increasing the sampling frequency of each digital input signal,
      a sample and hold circuit for receiving the output of said interpolation filter,
      a n-bit quantizer for converting the output of said sample and hold circuit to a n-bit digital stream,
      a n-bit digital-to-analog converter for converting the output of said n-bit quantizer to a converted analog signal, and
      a low pass analog filter for filtering the output of said n-bit digital-to-analog converter to substantially remove high frequency information therefrom that is outside of the bandwidth of said low pass analog filter;
   an offset circuit for offsetting said analog output level by an offset value; and
   a calibration circuit for determining said offset value in response to the generation of a calibration signal, said offset value set by said calibration circuit such that a predetermined digital input value on said digital input will result in the output of a predetermined analog output value.

6. The system of claim 5, wherein said offset circuit comprises:
   a digital summing junction disposed between said sample and hold circuit and said quantizer; and
   an offset register for storing said offset value as a digital value, the output of said offset register input to the second input of said summing junction for summing of said offset value with said digital signal output by said sample and hold circuit.

7. The system of claim 5, wherein said n-bit quantizer comprises a delta-sigma modulator.

8. A digital-to-analog converter with an integrated calibration system, comprising:
   a digital input for receiving a digital input signal;
   an interpolation section for receiving said digital input signal and increasing the sampling frequency thereof, and
   a quantizer for receiving the output of said interpolation section and converting it to a digital stream;
   a digital-to-analog convertor for converting the digital stream into a converted analog signal;
   an analog section including an analog low pass filter for filtering the converted analog signal output by said digital-to-analog converter and outputting an analog output signal to an analog output node;
   an offset register for storing a digital offset value;
   a summing junction for summing said offset value stored in said offset register with said digital input signal prior to input of said digital signal to said quantizer;
   a calibration circuit for determining said offset value in response to generation of a calibration signal, said offset value set by said calibration circuit such that a predetermined digital input value on said digital input will result in the output of a predetermined analog output value when said predetermined digital input value is summed with said offset value by said summing junction.

9. The system of claim 8, wherein said summing junction is disposed between said interpolation section and said quantizer.

10. The system of claim 8, wherein said quantizer is comprised of a delta-sigma modulator and outputs a one-bit digital stream.

11. The system of claim 8, wherein said interpolation section comprises:
   an interpolation filter utilizing a finite impulse response filter function operating in accordance with predetermined coefficients for said finite impulse response filter function; and
   a sample and hold circuit for sampling the output of said interpolation filter and increasing the sampling frequency thereof.

12. The system of claim 8, wherein said analog filter section comprises:
   a switched capacitor low pass filter for receiving the output of said digital-to-analog converter; and
   a continuous time low pass filter for receiving the output of said switched capacitor filter, the output of said continuous time filter connected to said analog output node.

13. The system of claim 8, wherein said calibration circuit comprises:
   means for forcing said digital input signal to a predetermined calibrating digital input signal;
   a sampling circuit for sampling the analog output level of said analog output signal that is output by said analog section; and
   register control circuitry for varying said offset value in said offset register until the analog output level of said analog output is substantially equal to a predetermined calibrating output signal when said predetermined calibrating input signal is input as said digital input signal.

14. The system of claim 13, wherein said predetermined calibrating digital input signal has a value of substantially zero and said predetermined calibrating analog output signal has a value of substantially zero.

15. The system of claim 13, and further comprising:
   an disabling circuit for isolating said analog output node from the output of said analog low pass filter in response to generation of said calibration signal; and
   a voltage control circuit for placing said analog output node at a predetermined voltage, said analog output node is isolated from the output of said analog low pass filter and said analog section by said disabling circuit.

16. The method of claim 13, wherein said register control circuitry is operable to vary the offset value of said offset register by a binary search algorithm, and latch the value of said offset value in said offset register when said analog output signal is substantially equal to said predetermined calibrating analog output signal.

17. The system of claim 8, and further comprising means for generating said calibration control signal in response to an external input signal.

18. The system of claim 8, and further comprising means for generating said calibration signal in response to said digital input signal having a predetermined value.

19. A method for calibrating a digital-to-analog converter, comprising the steps of:
   providing a digital input terminal;
   providing an analog output terminal;
   converting a digital input signal received on the digital input terminal to an analog output signal on the analog output terminal, the analog output level of the analog output signal corresponding to the digital value of the digital input signal;
   offsetting the analog output level by an offset value, the step of offsetting including the steps of:
      sampling the analog output level of the analog output signal when the digital input signal is disposed at a predetermined calibrating input signal; and
      varying the offset value until the analog output level of the output signal is substantially equal to a predetermined calibrating analog output signal when the digital input signal is forced to the predetermined calibrating input signal;
   determining the offset value in response to generation of a calibration signal such that a predetermined digital input value on the digital input terminal will result in the output of a predetermined analog output value on the analog output terminal.

20. The method of claim 19, wherein the predetermined calibrating digital input signal has a value of substantially zero and the predetermined calibrating analog output signal has a value of substantially zero.

21. The method of claim 19, and further comprising:
   isolating the analog output signal from the analog output terminal in response to generation of the calibration signal; and
   placing the analog output terminal at a predetermined voltage when the analog output terminal is isolated from the analog output signal by the step of isolating.

22. A method for calibrating a digital-to-analog converter, comprising the steps of:
   providing a digital input terminal;
   providing an analog output terminal;
   converting a digital input signal received on the digital input terminal to an analog output signal on the analog output terminal, the analog output level of the analog output signal corresponding to the digital value of the digital input signal;, the step of converting including the steps of:
      filtering the digital input signal through an interpolation filter to increase the sampling frequency thereof;
      processing the output of the interpolation filter through a sample and hold circuit;
      converting the output of a sample and hold circuit to a n-bit digital stream;
      converting the n-bit digital stream to a converted analog signal; and
      filtering the converted analog signal with a low pass analog filter to substantially remove high frequency information therefrom that is outside the bandwidth of the low pass analog filtering step;
   offsetting the analog output level by an offset value; and
   determining the offset value in response to generation of a calibration signal such that a predetermined digital input value on the digital input terminal will result in the output of a predetermined analog output value on the analog output terminal.

23. The method of claim 22, wherein the step of offsetting comprises:
   providing an offset register;
   storing the offset value as a digital value in the offset register; and
   summing the output of the offset register with the digital signal output by the sample and hold circuit, and prior to converting the output of the sample and hold circuit to the n-bit digital stream.

24. The method of claim 22, wherein the step of converting the output of the sample and hold circuit to a n-bit digital stream comprises processing the output of the sample and hold circuit through a delta-sigma modulator.

25. A method for calibrating a digital-to-analog converter, comprising the steps of:
receiving a digital input signal on a digital input;
increasing the sampling frequency of the digital input signal;
converting the digital signal with the increased sampling frequency to a n-bit digital stream;
converting the n-bit digital stream to a converted analog signal;
providing an analog low pass filter;
filtering the converted analog signal through the analog low pass filter;
providing an offset register;
storing in the offset register a digital offset value;
summing the digital offset value stored in the offset register with the digital input signal prior to conversion of the digital input signal to the n-bit digital stream; and
determining the offset value in response to generation of a calibration signal, the offset value set such that a predetermined digital input value on the digital input will result in the output of a predetermined analog output value.

26. The method of claim 25, wherein the step of summing comprises summing the output of the offset register with the digital signal after the sampling frequency thereof has been increased and prior to converting the digital signal to the one-bit digital stream.

27. The method of claim 25, wherein the step of converting the digital signal with the increased sampling frequency to a one-bit digital stream comprises processing the digital signal with the increased sampling frequency through a delta-sigma modulator.

28. The method of claim 25, wherein the step of increasing the sampling frequency comprises:
processing the digital input signal through an interpolation filter which processes the digital signal with a finite impulse response function; and
processing the output of the interpolation filter through a sample and hold circuit.

29. The method of claim 25, wherein the step of determining the offset value comprises:
forcing the digital input signal to a predetermined calibrating digital input signal;
sampling the analog output level of the analog output signal output from the analog low pass filter when the digital input signal is forced to the predetermined calibrating digital input signal; and
varying the offset value stored in the offset register until the analog output level of the analog output signal is substantially equal to a predetermined calibrating analog input signal when the digital input signal is forced to the predetermined calibrating digital input signal.

30. The method of claim 24, wherein the predetermined calibrating digital input signal has a value of substantially zero and the predetermined calibrating analog output signal has a value of substantially zero.

31. The method of claim 24, and further comprising:
providing an analog output terminal for receiving the analog output signal from the analog low pass filter;
isolating the analog output signal from the analog output terminal in response to generation of the calibration signal; and
placing the analog output terminal at a predetermined voltage when the analog output terminal is isolated, by the step of isolating.

* * * * *